US010575396B2

(12) United States Patent
Shiozaki et al.

(10) Patent No.: US 10,575,396 B2
(45) Date of Patent: Feb. 25, 2020

(54) CIRCUIT BOARD

(71) Applicant: Panasonic Intellectual Property Management Co., Ltd., Osaka (JP)

(72) Inventors: Ryosuke Shiozaki, Tokyo (JP); Yuto Suzuki, Miyagi (JP); Hideki Iwaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 30 days.

(21) Appl. No.: 15/920,508

(22) Filed: Mar. 14, 2018

(65) Prior Publication Data

US 2018/0279466 A1 Sep. 27, 2018

(30) Foreign Application Priority Data

Mar. 21, 2017 (JP) ................. 2017-054619

(51) Int. Cl.
| *H05K 1/02* | (2006.01) |
| *H01Q 1/38* | (2006.01) |
| *H01P 3/08* | (2006.01) |
| *H05K 3/42* | (2006.01) |
| *H01P 5/02* | (2006.01) |
| *H01Q 21/00* | (2006.01) |
| *H01Q 21/06* | (2006.01) |
| *H05K 1/11* | (2006.01) |

(52) U.S. Cl.
CPC ............ *H05K 1/0251* (2013.01); *H01P 3/08* (2013.01); *H01P 5/028* (2013.01); *H01Q 1/38* (2013.01);

(Continued)

(58) Field of Classification Search
CPC .......... H05K 1/0251; H05K 1/02; H05K 3/42; H05K 1/0243; H05K 1/115; H05K 1/0242;

(Continued)

(56) References Cited

U.S. PATENT DOCUMENTS

2009/0009399 A1* 1/2009 Gaucher ............ H01Q 21/0006
343/700 MS
2014/0306846 A1* 10/2014 Nakatsu ............ H01Q 21/0075
343/700 MS (Continued)

FOREIGN PATENT DOCUMENTS

JP 2002-359508 12/2002

OTHER PUBLICATIONS

Chin, LTCC Differential-Fed Patch Antennas with Rat-Race Feeding Structured, 2012, Progress In Electromagnetics Research C, vol. 32, pp. 95-108 (Year: 2012).*

(Continued)

*Primary Examiner* — Hai V Tran
(74) *Attorney, Agent, or Firm* — Seed IP Law Group LLP

(57) ABSTRACT

A circuit board includes: a substrate; a first power feed line disposed so as to be close to a plurality of radiating elements provided on a surface of the substrate and to extend in a first direction; a first connection conductor extending in a second direction orthogonal to the first direction, one end of the first connection conductor being connected to the first power feed line substantially at its central portion in the first direction; and a second power feed line that has a first line part extending in a third direction orthogonal to the second direction, the first line part joining to another end of the first connection conductor, and also has a second line part branching from the first line part, the second line part joining to the other end from a third direction side.

16 Claims, 10 Drawing Sheets

(52) U.S. Cl.
CPC ....... *H01Q 21/0075* (2013.01); *H01Q 21/065* (2013.01); *H05K 1/0242* (2013.01); *H05K 1/0243* (2013.01); *H05K 1/115* (2013.01); *H05K 3/42* (2013.01); *H05K 1/0248* (2013.01); *H05K 2201/093* (2013.01); *H05K 2201/0979* (2013.01); *H05K 2201/09254* (2013.01); *H05K 2201/09327* (2013.01); *H05K 2201/09727* (2013.01); *H05K 2201/10098* (2013.01)

(58) Field of Classification Search
CPC .. H01P 3/08; H01P 5/028; H01Q 1/38; H01Q 21/0075; H01Q 21/065
USPC ......................................................... 343/893
See application file for complete search history.

(56) References Cited

U.S. PATENT DOCUMENTS

2015/0194730 A1* 7/2015 Sudo .................. H01Q 9/045
343/905
2016/0079674 A1* 3/2016 Okunaga ................. H01Q 1/38
343/737
2018/0013194 A1* 1/2018 Shiozaki ............... H01Q 1/005

OTHER PUBLICATIONS

Chin "LTCC Differential-Fed Patch Antennas with Rat-Race Feeding Structures", 2012, Progress in Electromagnetic Research, vol. 32, pp. 95-108. (Year: 2012).*
Gomez Gacia "High-rejection wideband signal-interference microstrip filters using rat-race couplers", 2006, Electronics Letters, vol. 42, No. 20. (Year: 2006).*
Extended European Search Report, dated Aug. 16, 2018, for the related European Patent Application No. 18162164.0.
Kuo-Sheng Chin et al: "LTCC Differential-Fed Patch Antennas With Rat-Race Feeding Structures", Progress in Electromagnetics Research C, vol. 32, Jan. 1, 2012 (Jan. 1, 2012), pp. 95-108, XP055497328.
Gomez-Garcia R: "High-rejection wideband signal-interference microstrip filters using rat-race couplers", Electronics LET, IEE Stevenage, GB, vol. 42, No. 20, Sep. 28, 2006 (Sep. 28, 2006), pp. 1162-1164, XP006027472.

* cited by examiner

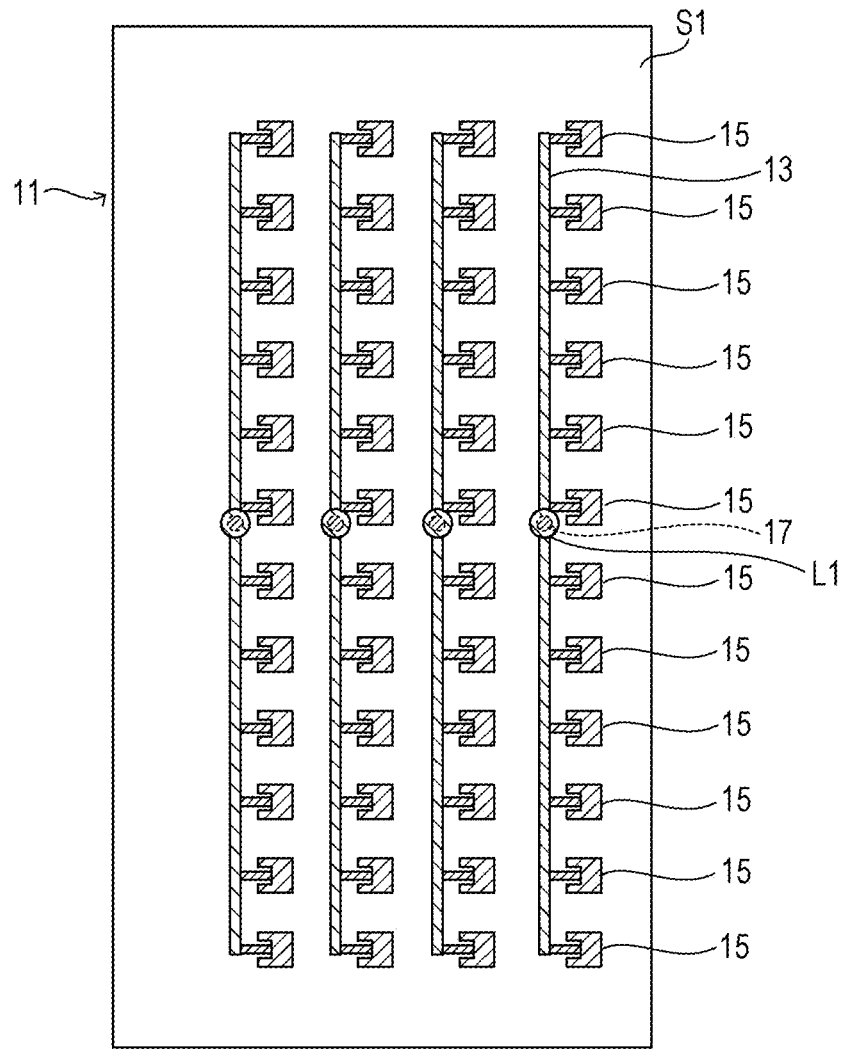

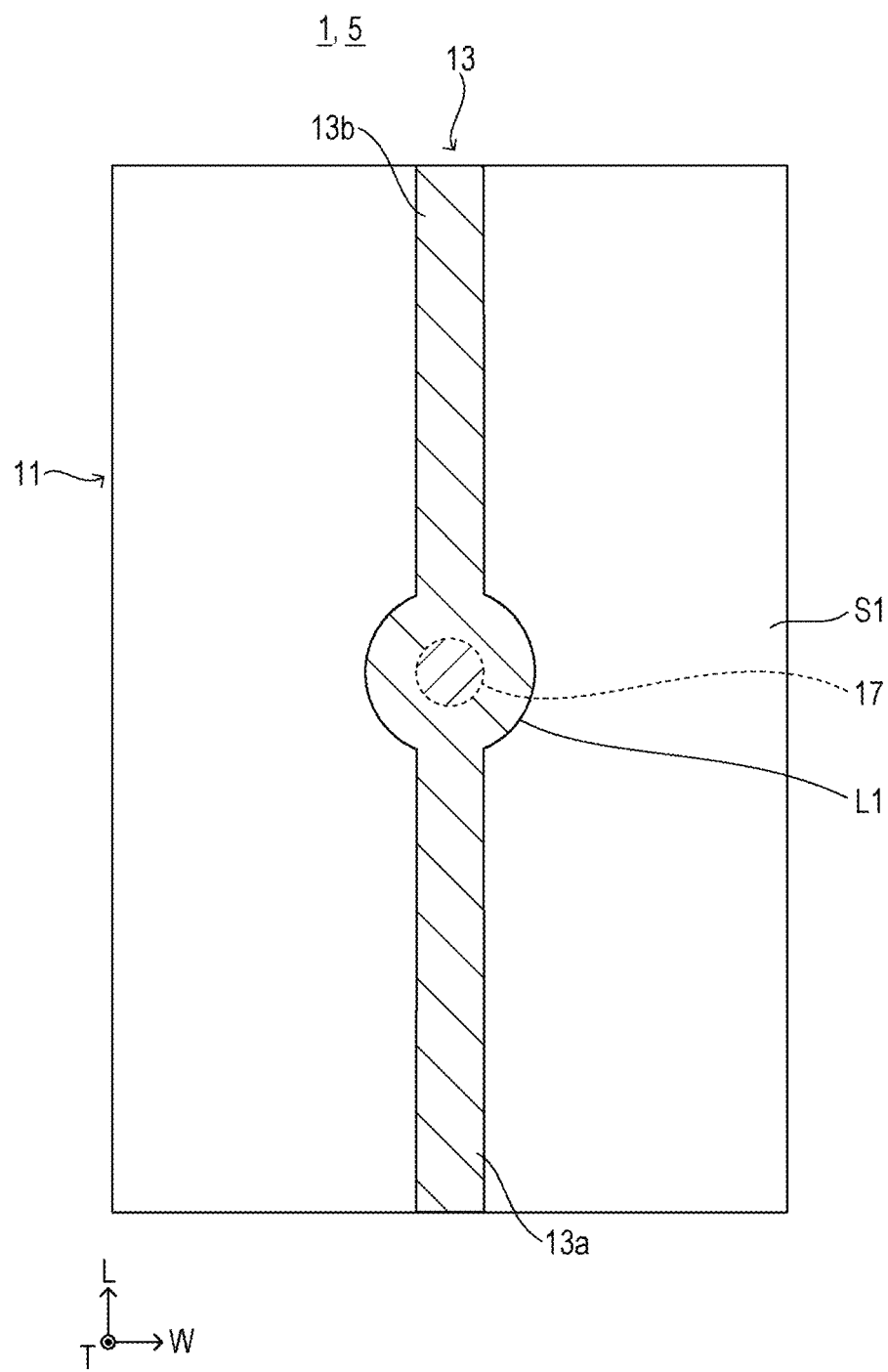

CIRCUIT BOARD

BACKGROUND

1. Technical Field

The present disclosure relates to a circuit board in which power feed lines to antenna elements (radiating elements) are formed on a substrate.

2. Description of the Related Art

Recently, structures have been used in which a planar antenna and surface-mounted parts are mounted on a circuit board such as a multilayer circuit board. When a planar antenna is to be used, it is customary to employ a planar array in which an antenna element array is handled as one branch and a plurality of branches are combined. In this case, central power feeding by which electric power is supplied to the center of each branch is available as a method of supplying electric power to each branch. In central power feeding, a plurality of branches are placed on a multilayer circuit board. Therefore, it is necessary to use, for example, a waveguide tube to supply electric power to a power feed line from a wiring layer provided separately from a wiring layer in which branches are formed. However, the use of a waveguide tube increases the cost of a module in which the circuit board is mounted (see, for example, Japanese Unexamined Patent Application Publication No. 2002-359508).

SUMMARY

One non-limiting and exemplary embodiment facilitates providing a circuit board that can perform central power feeding more inexpensively.

In one general aspect, the techniques disclosed here feature a circuit board that includes: a substrate; a first power feed line disposed so as to be close to a plurality of radiating elements provided on a surface of the substrate and to extend in a first direction; a first connection conductor extending in a second direction orthogonal to the first direction, one end of the first connection conductor being connected to the first power feed line substantially at its central portion in the first direction; and a second power feed line that has a first line part extending in a third direction orthogonal to the second direction, the first line part joining to another end of the first connection conductor, and also has a second line part branching from the first line part, the second line part joining to the other end from a third direction side.

The present disclosure contributes to providing a circuit board by which central power feeding can be performed at a cost lower than before.

Additional benefits and advantages in one aspect of the present disclosure will become apparent from the specification and drawings. The benefits and/or advantages may be individually obtained by some embodiments and features described in the specification and drawings, which need not all be provided in order to obtain one or more of such benefits and/or advantages.

BRIEF DESCRIPTION OF THE DRAWINGS

FIG. 1 is a top view illustrating a circuit board in a comparative example and the present disclosure;

FIG. 2A is a top view illustrating the central portion of a first power feed line provided on the circuit board, illustrated in FIG. 1, according to the comparative example and the present disclosure, as well as the periphery of the central portion;

DETAILED DESCRIPTION

A circuit board according to the present disclosure will be described below with reference to the drawings.

1. Definition

First, terms will be defined in a first section.

In each drawing, the L axis, W axis, and T axis are mutually orthogonal and respectively indicate the length direction, width direction, and height direction of circuit boards 1 and 5. Sometimes, the length direction, width direction, and height direction will be respectively referred to as the longitudinal direction, transverse direction, and vertical direction, as necessary. The length direction is an example of a first direction or a third direction, and the height direction is an example of a second direction.

2. Underlying Knowledge Forming Basis of the Present Disclosure

FIGS. 1 to 5 will be explained in a second section.

Figure 2B:
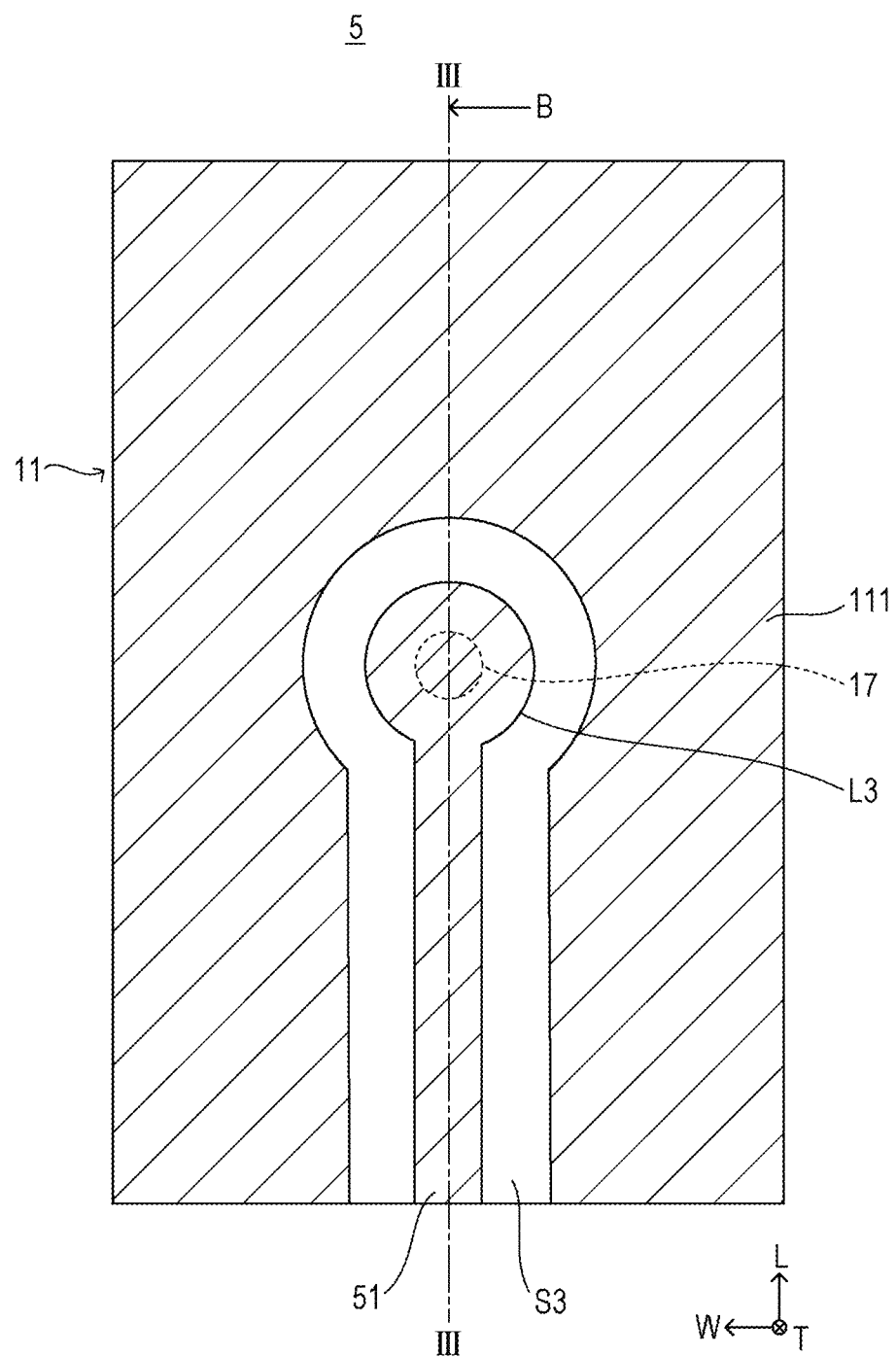
FIG. 2B is an enlarged rear view of another end of a second power feed line provided on the circuit board, illustrated in FIG. 1, according to the comparative example, as well as the periphery of the other end.
Figure 3:
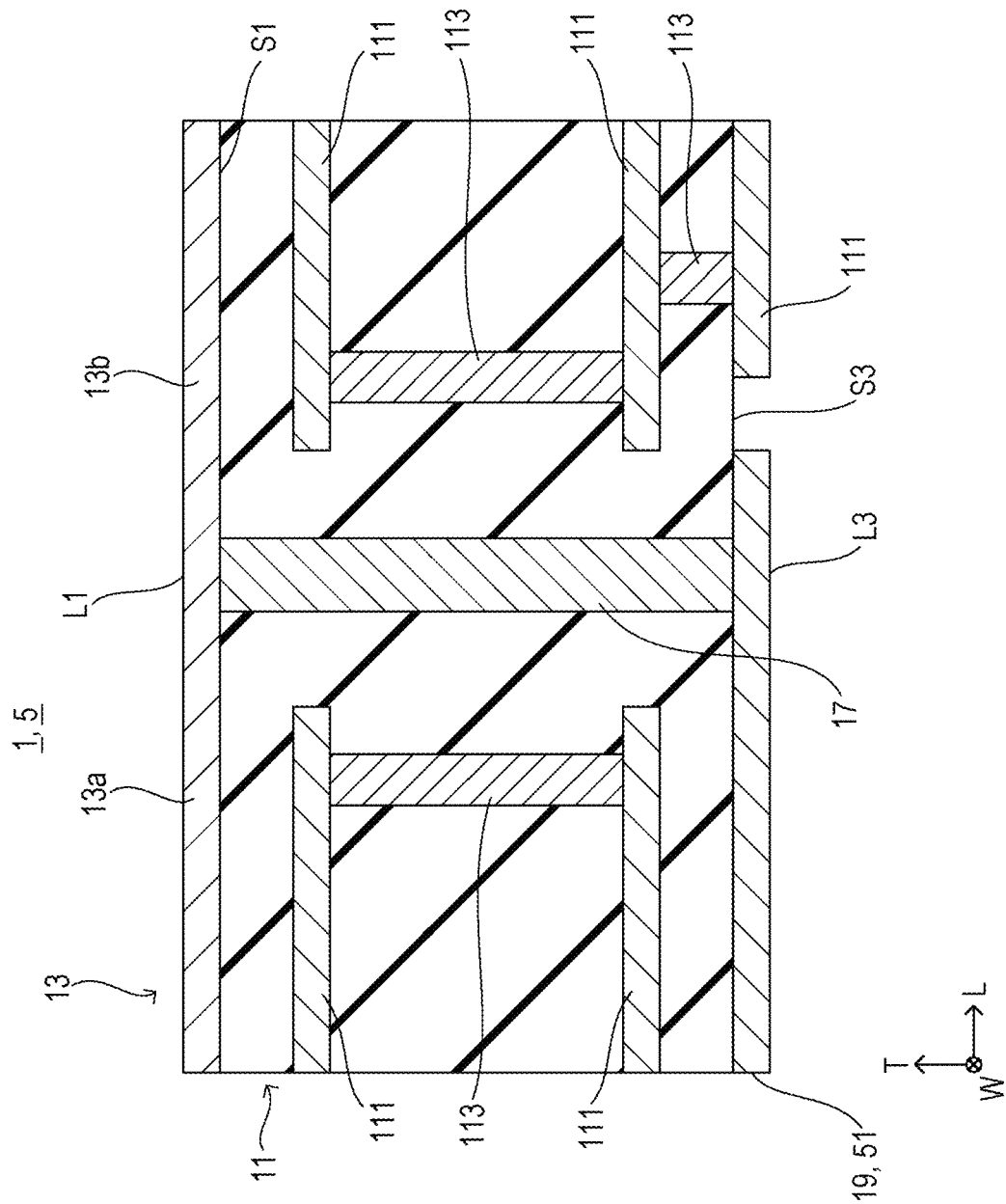
FIG. 3 is a cross-sectional view taken along line III-III in FIG. 2B as viewed from the direction indicated by an arrow B in the drawing.

FIG. 1 is a top view illustrating a circuit board 5 according to a comparative example. FIG. 2A is a top view illustrating the central portion of one first power feed line 13 provided on the circuit board 5 illustrated in FIG. 1, as well as the periphery of the central portion. FIG. 2B is an enlarged rear view of another end of one second power feed line 51 provided on the circuit board 5 illustrated in FIG. 1, as well as the periphery of the other end. FIG. 3 is a cross-sectional view taken along line III-III in FIG. 2B as viewed from the direction indicated by an arrow B in the drawing. In FIGS. 1, 2A, and 2B, for convenience, the first connection conductor 17 is transparent and is thereby indicated by a dotted line.

FIGS. 1 and 2A are also referenced in descriptions of a circuit board 1 according to the present disclosure. Therefore, the circuit board in these drawings is denoted by both of reference numerals 1 and 5.

As illustrated in FIGS. 1 to 3, the circuit board 5 has a multilayer substrate 11, a plurality of wiring layers 111, a plurality of second connection conductors 113, and at least one combination of the first power feed line 13, a plurality of radiating elements 15, the first connection conductor 17 and the second power feed line 51.

The multilayer substrate 11 is a laminated structure formed by laminating a plurality of dielectric layers (insulating layers) in the T-axis direction in a rectangular parallelepiped form. The multilayer substrate 11 has a first main surface S1, which forms an upper surface, and a second main surface S3 opposite to the first main surface S1 in the height direction. The multilayer substrate 11 also has four side surfaces besides the first main surface S1 and second main surface S3.

FIG. 1 illustrates an example of four combinations, each of which includes the first power feed line 13, a plurality of radiating elements 15, the first connection conductor 17, and the second power feed line 51. These combinations have the same structure, so the description below will focus on one combination.

The first power feed line 13, which is a strip line conductor extends in the L-axis direction on the first main surface S1. The central portion of the first power feed line 13 in the L-axis direction is defined a power feed point. The power feed point on the first power feed line 13 is joined to the first connection conductor 17, which will be described later. Therefore, the power feed point forms a land L1.

The first power feed line 13 may be disposed between two dielectric layers that are adjacent in the T-axis direction (that is, the first power feed line 13 may be an interlayer power feed line).

The plurality of radiating elements 15 are brought close to the first power feed line 13 along it. The plurality of radiating elements 15 are disposed between one end and another end of the first power feed line 13. Each two, adjacent in the L-axis direction, of the plurality of radiating elements 15 are placed with a predetermined spacing left between them. For convenience, the radiating elements 15 are illustrated only in FIG. 1.

The plurality of radiating elements 15 are connected to the first power feed line 13 through, for example, conductors used for connection. Each radiating element 15 and the first power feed line 13 may be formed so that the radiating element 15 is joined to the first power feed line 13 through an electric field or capacitance.

Although there is no particular limitation on the shape of the radiating element 15, it may have, for example, a rectangular, circular, C-like, or strip-line-like shape.

The first connection conductor 17 is, for example, a plated through-hole. It is formed so as to extend through the interior of the multilayer substrate 11 in the T-axis direction, from the first main surface S1 to the second main surface S3. More specifically, one end of the first connection conductor 17 abuts the land L1 (power feed point) on the first power feed line 13 and another end of the first connection conductor 17 abuts a land L3 (the other end of the second power feed line 51) formed on the second power feed line 51, which will be described later.

The second power feed line 51 is a strip line conductor. It is formed so as to, for example, extend in the L-axis direction on the second main surface S3. More specifically, as far as positions on an LW plane are concerned, one end of the second power feed line 51 is substantially identical to the one end of the first power feed line 13, and the other end of the second power feed line 51 is substantially identical to the power feed point on the first power feed line 13. The other end is joined to the first connection conductor 17 and thereby forms the land L3.

The second power feed line 51 may also be disposed between layers.

In this comparative example, the plurality of wiring layers 111 are disposed between layers in the multilayer substrate 11 as, for example, a ground layer. Each second connection conductors 113 is, for example, a via-hole conductor; it extends in the T-axis direction between two wiring layers (ground layers) 111 adjacent in the T-axis direction.

On the circuit board 5 structured as described above, a high-frequency signal (high-frequency current) in a millimeter wave band, for example, is supplied from a signal processing integrated circuit (IC), which is not illustrated, to the one end of the second power feed line 51. This high-frequency signal is given from the other end of the second power feed line 51 through the first connection conductor 17 to the power feed point on the first power feed line 13. At this power feed point, the high-frequency signal is essentially branched into two signals. One of the two signals is supplied to a backward half part 13b of the first power feed line 13, the backward half part 13b being more backward than the power feed point on the first power feed line 13 in the L-axis direction. The other of the two signals is supplied to a forward half part 13a of the first power feed line 13, the forward half part 13a being on the negative side in the L-axis direction. Each radiating element 15 receives electric power from the first power feed line 13 and emits an electric field. In central power feeding described above, it is prevented that a direction in which an electromagnetic wave is emitted is easily changed depending on the frequency in use, so a broad band can be used.

Each wiring layer (ground layer) 111 determines the characteristic impedance of a surrounding wire. The second connection conductors 113 have the effect of reducing the impedance of the first connection conductor 17.

Conditions under which three-dimensional electromagnetic field analysis is performed for the circuit board 5 structured as described above are that, for example, the specific inductive capacity of the multilayer substrate 11 is 3.4 and the thickness of the multilayer substrate 11 is 1.5 mm.

Figure 4:
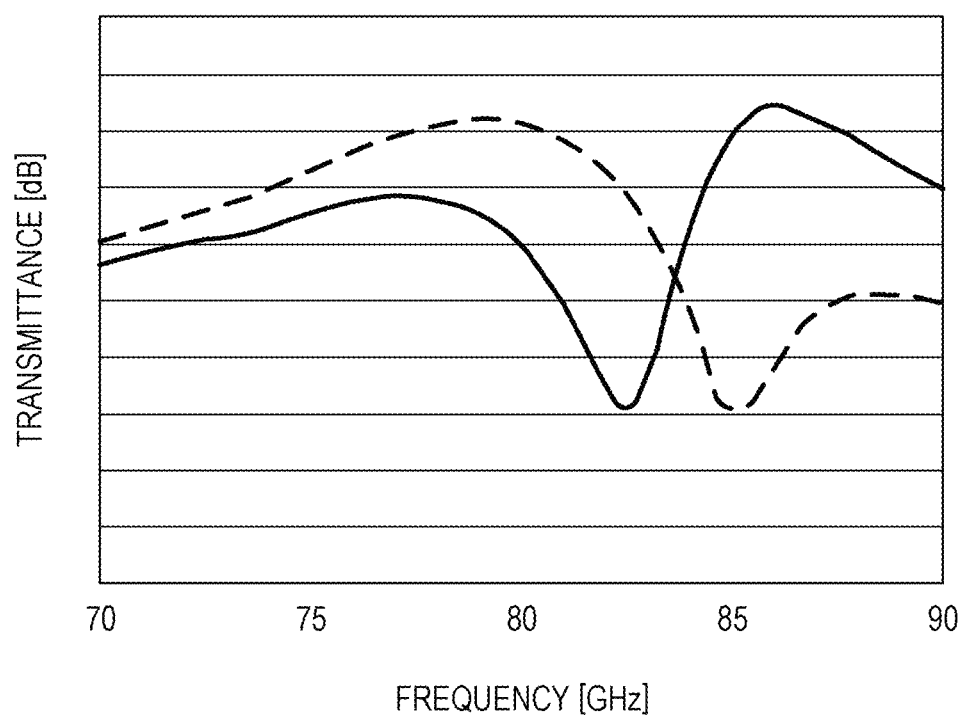
FIG. 4 is a graph indicating, for each frequency, the magnitude of the electric power of a high-frequency signal supplied to the forward portion and backward portion of the first power feed line, illustrated in FIG. 1, according to the comparative example.

FIG. 4 is a graph indicating, for each frequency, the magnitude of the electric power of a high-frequency signal supplied to the forward half part 13a and backward half part 13b of the first power feed line 13, with frequency [GHz] on the horizontal axis and transmittance [dB] on the vertical axis. In FIG. 4, electric power in the forward half part 13a is indicated by a solid line and electric power in the backward half part 13b is indicated by a broken line. It is found from FIG. 4 that electric power is not evenly distributed from the power feed point on the first power feed line 13 to the forward half part 13a and backward half part 13b. As described above, in central power feeding, it is prevented that a direction in which an electromagnetic wave is emitted is easily changed depending on the frequency in use, so a broad band can be used. However, if electric power is not evenly distributed to the forward half part 13a and backward half part 13b, the pattern of electromagnetic wave emission largely changes depending on the frequency in use. As a result, frequency bands available for the circuit board 5 may be narrowed.

Figure 5:
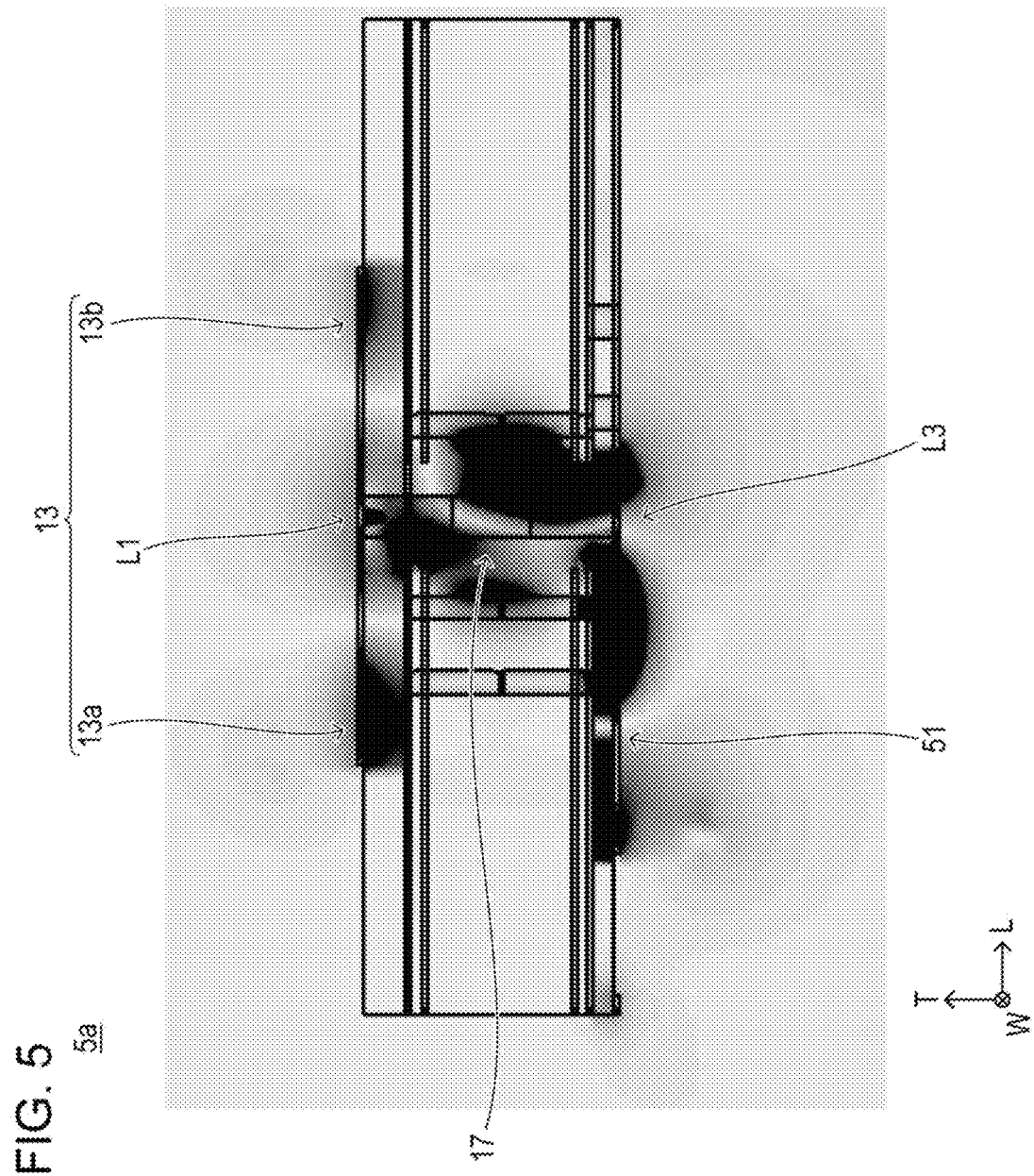
FIG. 5 illustrates the distribution of electric field intensity at a cross-section of the circuit board according to the comparative example, the cross-section being along a plane parallel to a TL plane.

Unevenness in electric power distribution as described above will be described. FIG. 5 illustrates the distribution of electric field intensity at a cross-section of a circuit board 5a, the cross-section being along a plane parallel to a TL plane, at a certain timing. In FIG. 5, the closer to black the color of a portion is, the higher the electric field in the portion is; the closer to white the color of a portion is, the lower the electric field in the portion is.

The main structure of the circuit board 5a in FIG. 5 is similar to the main structure of the circuit board 5 in FIG. 3. In FIG. 5, therefore, elements equivalent to corresponding elements in FIG. 3 will be denoted by like reference characters and detailed descriptions of these equivalent elements will be omitted.

In the i distribution of electric field intensity around the first connection conductor 17 in FIG. 5, the forward portion and backward portion are asymmetric with respect to the first connection conductor 17. Therefore, it is also found that high-frequency signals are transferred to the interior of the circuit board 5a in a state in which the asymmetric distribution in electric field intensity is maintained between the forward portion and the backward portion.

A possible reason for the asymmetric distribution in electric field intensity will be described below. The second power feed line 51 extends from the other end (power feed point) only in one direction (in the example in FIG. 5, the forward direction) and a high-frequency signal is transmitted through the second power feed line 51. In the opposite direction (in the example in FIG. 5, the backward direction), however, the other end is open. A parasitic capacitive component at this open portion causes the asymmetric distribution in electric field intensity. In the first power feed line 13, therefore, high-frequency signals having different signal intensities and the like propagate from the power feed point to different portions, one of which is in one direction and the other of which is in the opposite direction. As a result, asymmetricity occurs in electric power as illustrated in FIG. 4. As described above, it was found from three-dimensional electromagnetic field analysis that the asymmetric structure causes asymmetricity in electric power.

3. Circuit Board According to the Present Disclosure

Figure 6:
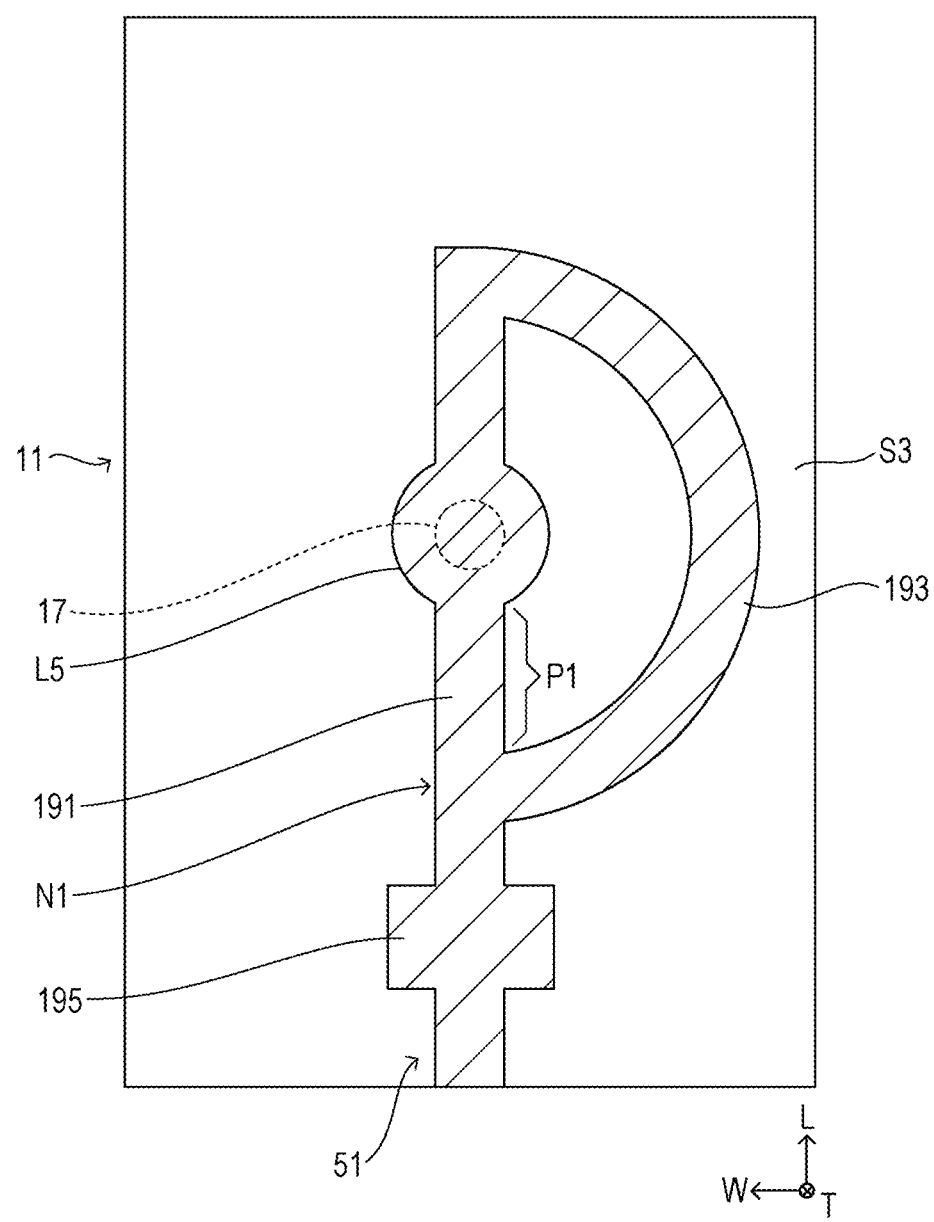
FIG. 6 is an enlarged rear view of the other end of a second power feed line, illustrated in FIG. 1, according to the present disclosure, as well as the periphery of the other end.

In a third section in which the circuit board 1 as illustrated in FIGS. 1, 2A, and 6 can be considered according to the above description, the circuit board 1 according to the present disclosure will be described with reference to FIGS. 7 to 9 besides FIGS. 1, 2A, and 6.

FIG. 1 is a top view illustrating the circuit board 1 according to the present disclosure. FIG. 2A is a top view illustrating the power feed point on the first power feed line 13 in illustrated in FIG. 1 as well as the periphery of the power feed point. FIG. 6 is an enlarged rear view of another end of a second power feed line 19 illustrated in FIG. 1, as well as the periphery of the other end.

As illustrated in FIGS. 1, 2A, and 6, the circuit board 1 differs from the circuit board 5 in that the circuit board 1 has the second power feed line 19 instead of the second power feed line 51. Elements, included in the circuit board 1, equivalent to corresponding elements included in the circuit board 5 will be denoted by like reference characters and descriptions of these equivalent elements will be omitted. For convenience, the ground layer 111 on the second main surface S3 is not illustrated in FIG. 6.

Results in three-dimensional electromagnetic field analysis showed that when the thickness of the multilayer substrate 11 is sufficiently small, influence of asymmetricity as described above is small. More specifically, it was found that if $\lambda e$ designates the effective wavelength of a high-frequency signal, when the thickness of the multilayer substrate 11 is about smaller than $\lambda e/2$, influence of asymmetricity can be reduced. However, when the thickness of the multilayer substrate 11 is to be determined, not only influence of asymmetricity but also other factors such as the number of wiring layers 111 and the impedances of wires need to be considered. Therefore, the thickness of the multilayer substrate 11 may not be smaller than $\lambda e/2$. If, for example, a millimeter wave band is used, $\lambda e/2$ may become 1 mm or smaller. To assure high reliability, however, the thickness of the multilayer substrate 11 is, for example, $\lambda e/2$ or larger (more specifically, about 1.2 mm to about 1.6 mm). According to the present disclosure as well, the thickness of the multilayer substrate 11 is exemplarily $\lambda e/2$ or larger. In this case, influence of asymmetricity needs to be reduced by a method other than thinning the multilayer substrate 11.

The second power feed line 19 is, for example, a strip line conductor formed from a plated pattern. The second power feed line 19 includes a first line part 191, a second line part 193, and a stub 195.

The first line part 191 extends in the forward direction of the L axis on the second main surface S3. As far as positions on an LW plane are concerned, for example, one end of the first line part 191 is essentially identical to the one of the first power feed line 13, and another end of the first line part 191 is substantially identical to the power feed point on the first power feed line 13. The other end is joined to the first connection conductor 17 and thereby forms a land L5.

To reduce asymmetricity in the distribution of electric field intensity, according to the present disclosure, the first line part 191 and first power feed line 13 will be described, assuming that they extend in the same direction. However, this is not a limitation; the first line part 191 and first power feed line 13 may extend in different directions.

The second power feed line 19 may also be disposed between layers.

The second line part 193 branches from the first line part 191 at one end of the second line part 193, and joints to the other end of the first line part 191 at another end of the second line part 193 from an L-axis direction side. More specifically, at a node N1 set on the first line part 191, the second line part 193 branches at its one end from the first line part 191, after which the second line part 193 is curved toward the L-axis direction side of the other end (land L5) of the first line part 191 so as to bypass the land L5, extends toward the negative side in the L-axis direction, and joints to the other end of the first line part 191 (that is, the land L5) from its backward side (that is, from the positive side in the L-axis direction).

Now, the length of the second line part 193 from the one end to the other end will be defined l1. Although there is no particular limitation on the line length l1, its example will be described below.

First, $\phi$ will be defined as described below. The symbol $\phi$ is an amount by which the phase of a high-frequency signal is shifted in a portion P1 from the node N1 on the first line part 191 to its other end. In this case, the second line part 193 is designed to, for example, a length that is enough to shift the phase of a high-frequency signal by $\phi + 2n\pi$ (n is an arbitrary natural number). To reduce asymmetricity in the distribution of electric field intensity as much as possible, n is set to, for example, 1.

In other words, the line length l1 is represented as in equation (1) below.

$$l1 = \lambda e + \frac{\phi}{2\pi} \cdot \lambda e \quad (1)$$

where λe is a know value representing the effective wavelength of the high-frequency signal.

If the line length l1 is enough to reduce asymmetricity in the distribution of electric field intensity, the value of the line length l1 may be any value other than the value obtained from equation (1) above.

There is no particular limitation on the shape of the second line part 193. To reduce capacitive coupling with the land L5 as much as possible, for example, the second line part 193 is formed in a portion in which any point is equally distant from the land L5. That is, the second line part 193 is formed in an arc shape in a plan view viewed from above.

A transmission loss difference is caused by a line length difference M between the second line part 193 and the portion P1 in the first line part 191. Specifically, the line length l1 of the second line part 193 is n×φe longer than the length of the portion P1. To reduce the transfer loss difference, therefore, the line width of the second line part 193, for example, is larger than the line width of the portion P1. It suffices to design specific line widths of the portion P1 and second line part 193, as necessary.

A distribution ratio of signal electric power at the node N1 depends on a ration between the characteristic impedance of the portion P1 and the characteristic impedance of the second line part 193. The characteristic impedances of the portion P1 and second line part 193 can be changed by changing their line widths. More specifically, among lines made of materials having the same electric resistivity, the wider the line is, the lower the characteristic impedance is, so much electric power tends to be distributed to the line. Therefore, when the line width of the second line part 193 is made wider than the line width of the portion P1 as described above, it is possible to reduce a difference in electric power distributed to the forward half part 13a and backward half part 13b of the first power feed line 13.

The stub 195 is provided to reduce the reflection of a high-frequency signal (that is, to match impedances) due to the branch of the line at the node N1 (that is, due to the node N1). On the first line part 191, the stub 195 is positioned within a distance of λe/2 from the node N1 toward the negative side in the L-axis direction.

4. Results in Three-Dimensional Electromagnetic Field Analysis for the Circuit Board According to the Present Disclosure Conditions under which three-dimensional electromagnetic field analysis is performed for the circuit board 1 structured as described above are the same as in the second section.

Figure 7:
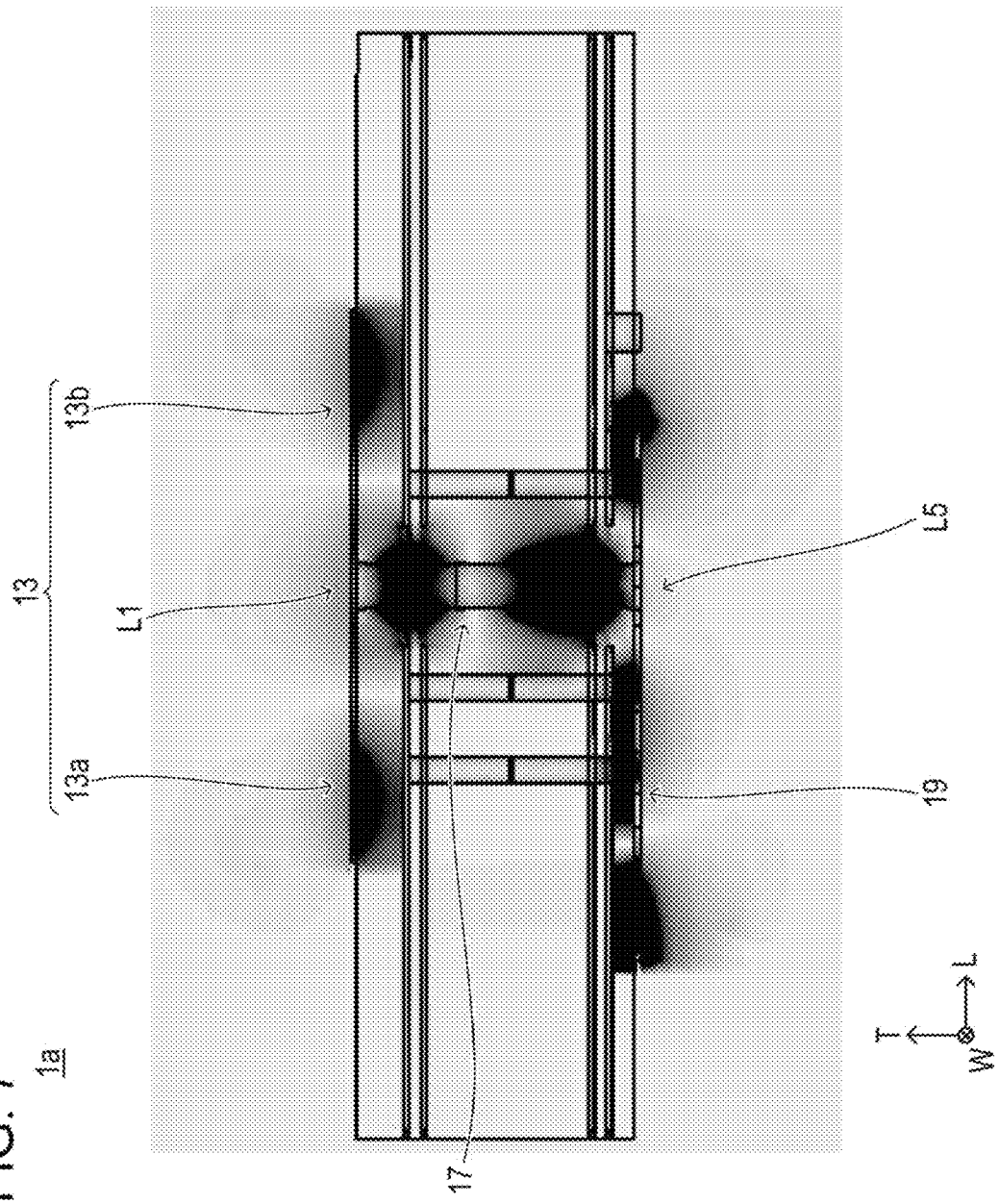
FIG. 7 illustrates the distribution of electric field intensity at a cross-section of the circuit board according to the present disclosure, the cross-section being along a plane parallel to a TL plane.

FIG. 7 illustrates the distribution of electric field intensity at a cross-section of a circuit board 1a at a certain timing, the cross-section being cut along a plane parallel to a TL plane. In FIG. 7 as well, the closer to black the color of a portion is, the higher the electric field in the portion is, as in FIG. 5.

The circuit board 1a in FIG. 7 is substantially similar to the circuit board 1 in FIG. 3. In FIG. 7, therefore, elements equivalent to corresponding elements in FIG. 3 will be denoted by like reference characters and detailed descriptions of these equivalent elements will be omitted.

In FIG. 7, symmetricity in the distribution of electric field intensity around the first connection conductor 17 is largely improved in the forward portion and the backward portion with respect to the first connection conductor 17 when compared with FIG. 5. This symmetricity in the distribution of electric field intensity is achieved by the second power feed line 19 according to the present disclosure. Since the second power feed line 19 is provided, high-frequency signals that have substantially the same intensity and are substantially in phase are supplied to the first connection conductor 17 from the negative side and positive side in the L-axis direction, improving symmetricity in the distribution of electric field intensity.

In particular, since high-frequency signals that are substantially in phase are supplied to the first connection conductor 17 from both side in the L-axis direction as described above, the line length difference Δ1 between the second line part 193 and the portion P1 of the first line part 191 is n×λe (n is an arbitrary natural number).

Figure 8:
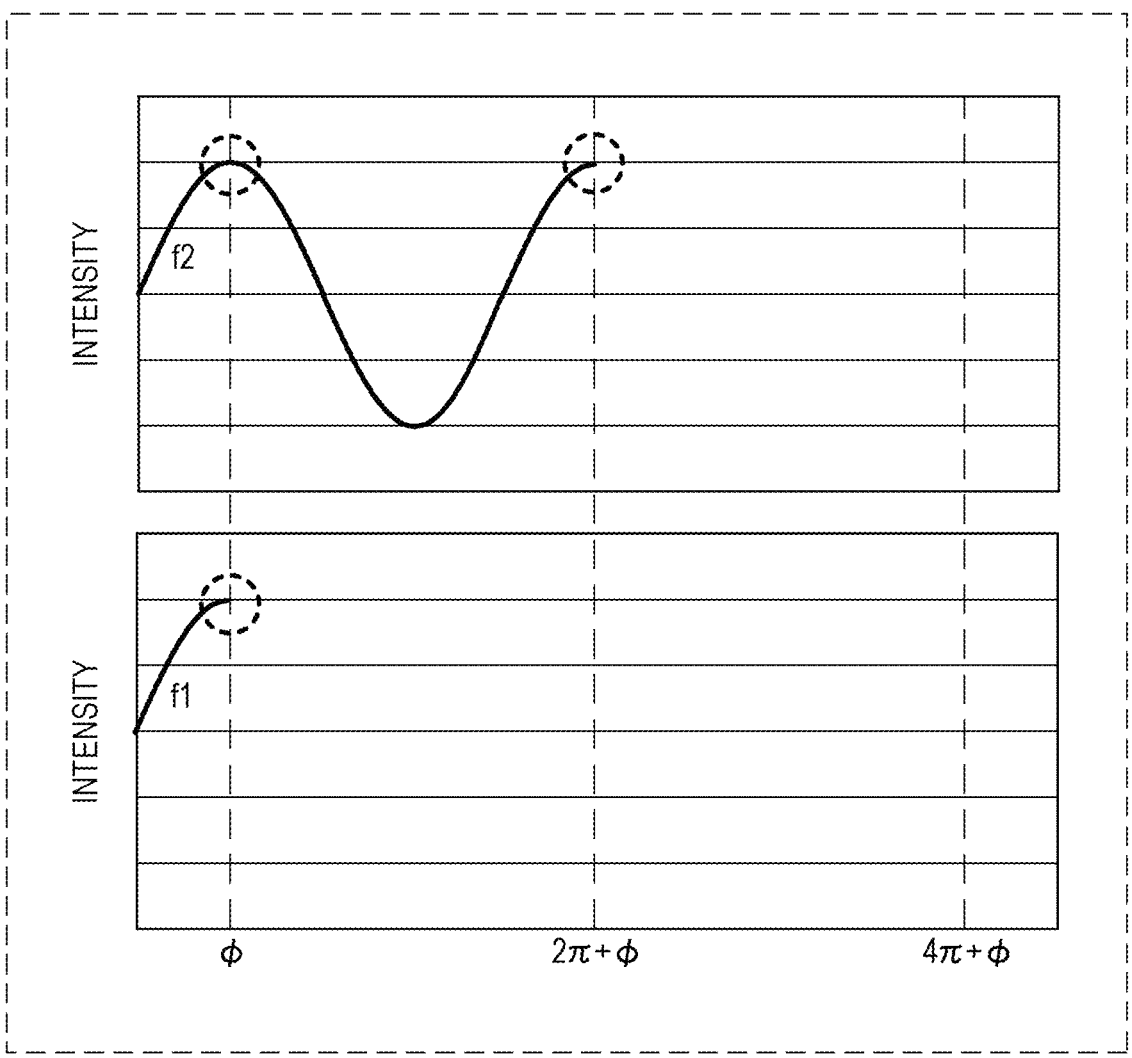
FIG. 8 illustrates relationships of the phase of a high-frequency signal entered into a first connection conductor according to the present disclosure.

FIG. 8 illustrates relationships of the phases of high-frequency signals entered into the first connection conductor 17 according to the present disclosure. In the example in FIG. 8, these high-frequency signals are each a sine wave and n is 1. In particular, the upper graph in FIG. 8 indicates a time waveform f1 of a high-frequency signal that passes through only the first line part 191 and reaches the land L5 (this high-frequency signal will be referred to below as the first high-frequency signal f1), and the lower graph in FIG. 8 indicates a time waveform f2 of a high-frequency signal that passes through the second line part 193 and reaches the land L5 (this high-frequency signal will be referred to below as the second high-frequency signal f2).

As illustrated in FIG. 8, if the line length difference Δ1 is 2nπ, a phase delay of 2π occurs in the second high-frequency signal f2 with respect to the first high-frequency signal f1. However, the first high-frequency signal f1 and second high-frequency signal f2 have substantially the same intensity at the land L5. Therefore, symmetricity in the distribution of electric field intensity is improved as described above. In particular, when n is 1, the transfer loss in the second line part 193 can be minimized, so symmetricity in the distribution of electric field intensity is further improved.

Figure 9:
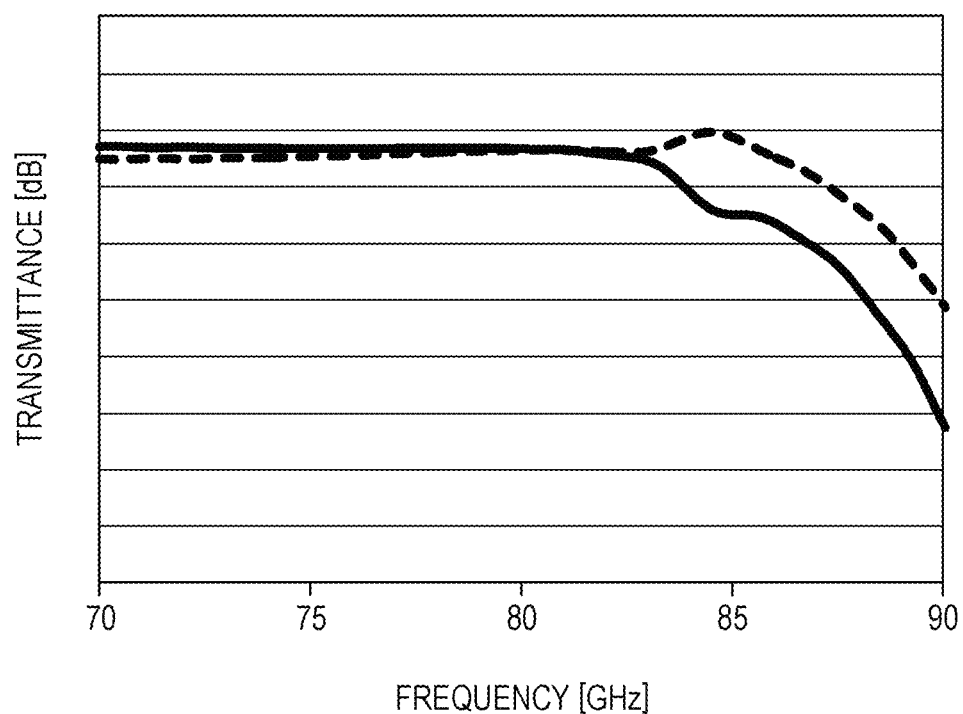
FIG. 9 is a graph indicating, for each frequency, the magnitude of the electric power of a high-frequency signal supplied to the forward portion and backward portion of the first power feed line, illustrated in FIG. 1, according to the present disclosure.

FIG. 9 is a graph indicating, for each frequency, the magnitude of the electric power of a high-frequency signal supplied to the forward half part 13a and backward half part 13b of the first power feed line 13 on the circuit board 1 that is designed so that the line length difference is about 0.38 mm, with frequency [GHz] on the horizontal axis and transmittance [dB] on the vertical axis. In FIG. 9, electric power in the forward half part 13a is indicated by a solid line and electric power in the backward half part 13b is indicated by a broken line. FIG. 9 indicates that electric power is more evenly distributed from the power feed point on the first power feed line 13 to the forward half part 13a and backward half part 13b over a wide band (for example, from about 70 GHz to about 80 GHz) around the frequency band in use (79-GHz band).

5. Operation and Effects of the Circuit Board According to the Present Disclosure First of all, the circuit board 1 according to the present disclosure has the first power feed line 13 disposed so as to be close to a plurality of radiating elements 15 and to extend in the L-axis direction, as described above. In addition, the circuit board 1 has the land L1 disposed so as to extend in the T-axis direction and to be placed at the central portion of the first power feed line 13 in the L-axis direction, and also has the first connection conductor 17 connected to one end of the circuit board 1. The circuit board 1 further has the second power feed line 19 including the first line part 191, which extends in the L-axis direction and joins to the other end (land L5) of the first connection conductor 17, and the second line part 193, which branches from the first line part 191 and joins to the other end (land L5) from an L-axis direction side. In this structure, it is possible to reduce a difference in power distributed to the forward half part 13a and backward half part 13b of the first power feed line 13 over a wide band around the frequency band in use. Furthermore, since the need to use a waveguide tube is eliminated, it is possible to provide the circuit board 1 that can be structured at a low cost.

Since the line length l1 of the second line part 193 is determined according to an integer multiple of the effective wavelength of a high-frequency signal, it is possible to make an approximate match between the phase of the first high-frequency signal f1 and the phase of the second high-frequency signal f2 (see FIG. 8). Therefore, symmetricity in the distribution of electric field intensity can be improved in the forward half part 13a and backward half part 13b, so it is possible to reduce a difference in power distributed to the forward half part 13a and backward half part 13b of the first power feed line 13 over a wide band around the frequency band in use.

On the first line part 191 of the second power feed line 19, the stub 195 is positioned within a distance equal to a half of the effective wavelength from the node N1 located between the first line part 191 and the second line part 193, it is possible to reduce the reflection of a high-frequency signal at the node N1.

Since the wiring layers 111 are provided in the multilayer substrate 11, the characteristic impedances of surrounding wires can be made adequate.

Both the first power feed line 13 and the second power feed line 19 extend in the L-axis direction, so it is possible to reduce a difference in power distributed to the forward half part 13a and backward half part 13b.

Since the line width of the second line part 193 is larger than the line width of the first line part 191, transmission loss in the second line part 193 can be relatively reduced. As a result, it becomes easy to reduce a difference in power distributed to the forward half part 13a and backward half part 13b.

As illustrated in FIG. 3 and other drawings, the circuit board 1 includes a plurality of wiring layers 111 and a plurality of second connection conductors 113, which are substantially symmetric with respect to a plane perpendicular to both the first power feed line 13 and the second power feed line 19, which are linked together by the first connection conductor 17. This can improve symmetricity in the distribution of electric field intensity in the forward half part 13a and backward half part 13b, so it is possible to reduce a difference in power distributed to the forward half part 13a and backward half part 13b of the first power feed line 13.

The present disclosure can be realized by software, hardware, or software in cooperation with hardware.

Each functional block used in the description of the embodiment described above can be partly or entirely realized by an LSI such as an integrated circuit, and each process described in the embodiment may be controlled partly or entirely by the same LSI or a combination of LSIs. The LSI may be individually formed as chips, or one chip may be formed so as to include part or all of the functional blocks. The LSI may include a data input and output coupled thereto. The LSI here may be referred to as an IC, a system LSI, a super LSI, or an ultra LSI depending on a difference in the degree of integration.

However, the technique of implementing an integrated circuit is not limited to the LSI and may be realized by using a dedicated circuit, a general-purpose processor, or a special-purpose processor. In addition, a field programmable gate array (FPGA) that can be programmed after the manufacture of the LSI or a reconfigurable processor in which the connections and the settings of circuit cells disposed inside the LSI can be reconfigured may be used. The present disclosure can be realized as digital processing or analogue processing.

If future integrated circuit technology replaces LSIs as a result of the advancement of semiconductor technology or other derivative technology, the functional blocks could be integrated using the future integrated circuit technology. Biotechnology can also be applied.

The circuit board according to the present disclosure can achieve central power feeding with a more inexpensive structure and can thereby be applied to a radar and the like.

What is claimed is:

1. A circuit board comprising:
    a substrate;
    a first power feed line disposed so as to be close to a plurality of radiating elements provided on a surface of the substrate and to extend in a first direction;
    a first connection conductor extending in a second direction orthogonal to the first direction and orthogonal to the surface of the substrate, one end of the first connection conductor being connected to the first power feed line substantially at a central portion of the first power feed line in the first direction; and
    a second power feed line that has a first line part extending in a third direction orthogonal to the second direction, the first line part connecting to another end of the first connection conductor, and also has a second line part branching from the first line part, the second line part connecting to the another end along the third direction.

2. The circuit board according to claim 1, wherein a line length of the second line part is determined according to an integer multiple of an effective wavelength of an alternate current to be supplied to the first line part.

3. The circuit board according to claim 2, further comprising a stub positioned within a distance equal to a half of the effective wavelength from a node located between the first line part and the second line part, the stub being provided on the first line part.

4. The circuit board according to claim 1, wherein a thickness of the substrate in the second direction is at least a half of an effective wavelength of an alternate current to be supplied to the first line part.

5. The circuit board according to claim 1, wherein at least the first power feed line and the first line part of the second power feed line are each a linear conductor.

6. The circuit board according to claim 1, further comprising a ground layer.

7. The circuit board according to claim 1, wherein the first direction and the third direction are essentially the same direction.

8. The circuit board according to claim 1, wherein the first connection conductor is manufactured by plating a through-hole.

9. The circuit board according to claim 1, wherein a line width of the second line part is larger than a line width of the first line part.

10. The circuit board according to claim 1, further comprising wiring layers and second connection conductors, which are formed so as to be substantially symmetric with respect to a plane perpendicular to both the first power feed line and the second power feed line, which are linked together by the first connection conductor.

11. The circuit board according to claim 1, wherein the first direction is a direction along which the plurality of radiating elements are arranged.

12. The circuit board according to claim 1, wherein the first power feed line is disposed on the surface of the substrate.

13. The circuit board according to claim 1, wherein the second line part connects to the another end along the third direction from a side opposite from a side of the first line part.

14. The circuit board according to claim 13, wherein the second line part curves around the another end and connects to the another end from the side opposite from the side of the first line part.

15. The circuit board according to claim 1, further comprising:
   wiring layers, and
   one or more second connection conductors extending in the second direction to connect between the wiring layers.

16. The circuit board according to claim 15, wherein the wiring layers are ground layers.

* * * * *